*US007583773B2*

United States Patent
Su et al.

(10) Patent No.: US 7,583,773 B2
(45) Date of Patent: Sep. 1, 2009

(54) FREQUENCY SYNTHESIZING DEVICE WITH AUTOMATIC CALIBRATION

(75) Inventors: Peng-Un Su, Hsinchu (TW); Chih-Hung Chen, Hsinchu (TW); Horng-Yuan Shih, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 391 days.

(21) Appl. No.: 11/024,434

(22) Filed: Dec. 30, 2004

(65) Prior Publication Data

US 2006/0104398 A1    May 18, 2006

(30) Foreign Application Priority Data

Nov. 12, 2004   (TW)   ............................... 93134816 A

(51) Int. Cl.
    *H03D 3/24*       (2006.01)
(52) U.S. Cl. .................... 375/375; 375/376; 375/344; 327/147; 327/156; 331/2; 331/17; 331/44
(58) Field of Classification Search .................. 375/371, 375/373–376, 344; 327/145–148, 155–157; 331/2, 16, 17, 34, 44, 48, 344
    See application file for complete search history.

(56) References Cited

U.S. PATENT DOCUMENTS

| | | | | |
|---|---|---|---|---|
| 4,272,729 A | * | 6/1981 | Riley, Jr. ...................... 331/1 A |
| 6,064,947 A | * | 5/2000 | Sun et al. ...................... 702/106 |
| 6,545,547 B2 | * | 4/2003 | Fridi et al. ...................... 331/16 |
| 6,731,176 B2 | | 5/2004 | Su et al. |
| 6,747,519 B2 | | 6/2004 | Jaehne et al. |
| 6,870,411 B2 | * | 3/2005 | Shibahara et al. ........... 327/156 |
| 6,952,124 B2 | * | 10/2005 | Pham ......................... 327/156 |
| 7,015,763 B1 | * | 3/2006 | Hallivuori et al. ............. 331/11 |
| 7,023,285 B2 | * | 4/2006 | Nord et al. ..................... 331/16 |
| 7,154,342 B2 | * | 12/2006 | Munker et al. ................ 331/11 |

* cited by examiner

*Primary Examiner*—Dac V Ha
(74) *Attorney, Agent, or Firm*—Rabin & Berdo, P.C.

(57) ABSTRACT

A frequency synthesizer with automatic calibration includes a voltage-controlled oscillator, which has several working bands for receiving a coarse-tuned signal and a fine-tuned signal and generating an output signal in the working band of the coarse-tuned signals; preliminary frequency divider unit, which receives the output signal and generates an intermediate signal by frequency dividing; a feedback frequency divider unit, which receives the intermediate signal and generates a feedback signal by frequency dividing; an automatic calibration unit, which receives the input signal and the intermediate signal to generate a coarse-tuned signal; a phase-frequency comparator, which compares the input signal with the feedback signal and generates an error signal according to the frequency and phase differences between the input signal and the feedback signal; and a low-pass filter, which filters the error signal and generates a fine-tuned signal.

30 Claims, 4 Drawing Sheets

FREQUENCY SYNTHESIZING DEVICE WITH AUTOMATIC CALIBRATION

BACKGROUND OF THE INVENTION

1. Field of Invention

The invention relates to a frequency synthesizing device and, in particular, to a frequency synthesizing device and method with automatic calibration.

2. Related Art

The oscillating frequency of a voltage-controlled oscillator (VCO) is determined by inductors and capacitors connected in parallel. One can change the oscillating frequency of the VCO by adjusting the capacitance.

FIG. 1 shows a frequency synthesizer in the prior art. The frequency synthesizer includes a VCO 120, a frequency divider device 200, a frequency phase detector 300, and a low-pass filter 190. The VCO 120 generates an output signal. The frequency divider device 200 removes the frequency of the input signal and produces a feedback signal. The phase detector 300 compares the frequencies and phases of the input signal and the feedback signal. If the frequency of the input signal is higher than that of the feedback signal, the control voltage of the VCO 120 is raised; otherwise, the control voltage is lowered.

Since the VCO has many bands. The control method is done by digital signal rough-tuning, setting the working band of the VCO. The fine-tuning is done with analog signals, locking the output signal at a predetermined frequency.

The frequency synthesizing device proposed in the U.S. Pat. No. 6,731,176 sets the VCO in an initial band and uses a frequency locking detector to detect whether the frequency locking is successful. If the frequency locking is unsuccessful for a while, then the VCO is adjusted to an adjacent band to start frequency locking again until it is successful. The VCO is then set at that band. Since the frequency locking detector operates at the comparison frequency, its speed is slower.

The frequency synthesizing device proposed in the U.S. Pat. No. 6,747,519 performs rough tuning using a comparison voltage. If after a period of time the control voltage of the VCO still exceeds a predetermined voltage range, it means the frequency locking is unsuccessful. The VCO is adjusted to an adjacent band to start frequency locking again until it is successful. The VCO is then set at that band. Such a device often has to try many bands before a frequency locking is successful. Moreover, comparing analog voltage signals may be easily affected by the variation in production process.

Through the two patents provide feasible frequency locking methods, it takes some time for the frequency synthesizer to lock a frequency in order to determine whether the selected band is correct. Thus, the rough tuning is completely after a longer time. This is unacceptable for systems that have stricter requirement in the frequency synthesizing time.

SUMMARY OF THE INVENTION

In view of the foregoing, the invention provides a frequency synthesizing device with automatic calibration.

An objective of the invention is to provide a frequency synthesizing device that can rapidly complete rough tuning for high-speed operations without being affected by the variation in production process.

The disclosed frequency synthesizing device with automatic calibration is used to synthesize signals of a predetermined frequency. It includes a VCO, a preliminary frequency divider unit, a feedback frequency divider unit, an automatic calibration unit, a phase-frequency comparator, and a low-pass filter.

The VCO has several working bands to receive a coarse-tuned signal and a fine-tuned signal and generates an output signal in the working band set by the coarse-tuned signal. The preliminary frequency divider unit receives the output signal from the VCO and generates an intermediate signal by frequency dividing. The feedback frequency divider unit receives the intermediate signal and generates a feedback signal by frequency dividing. The automatic calibration unit receives the input signal and the intermediate signal to generate a coarse-tuned signal. The phase-frequency comparator compares the input signal with the feedback signal and generates an error signal according to the frequency and phase differences between the input signal and the feedback signal. The low-pass filter filters the error signal and generates a fine-tuned signal.

If the automatic calibration unit can operate at a sufficiently high frequency, then it can directly receive the output signal, omitting the preliminary frequency divider unit.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
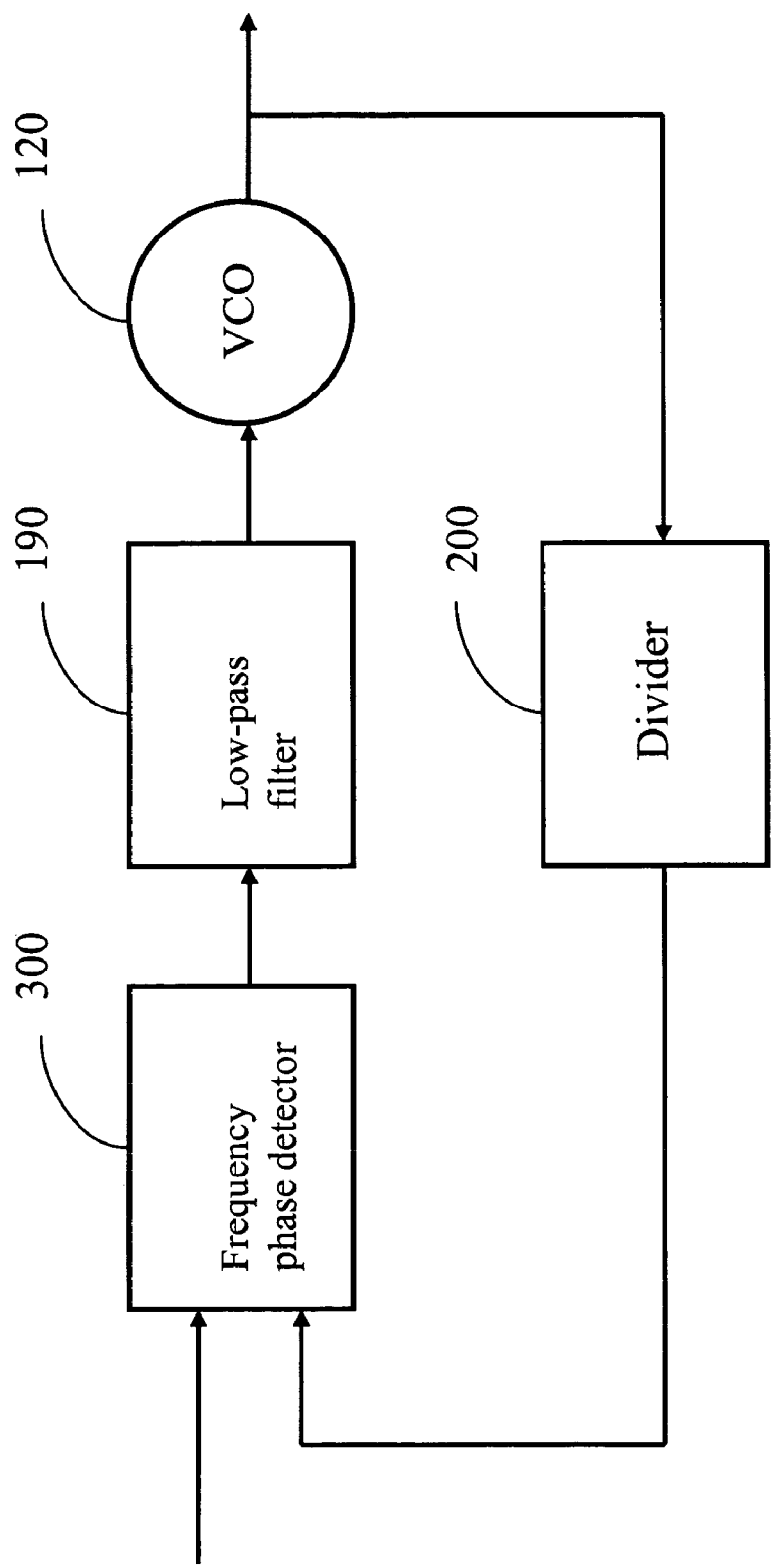
FIG. 1 shows a frequency synthesizer in the prior art.
Figure 2:
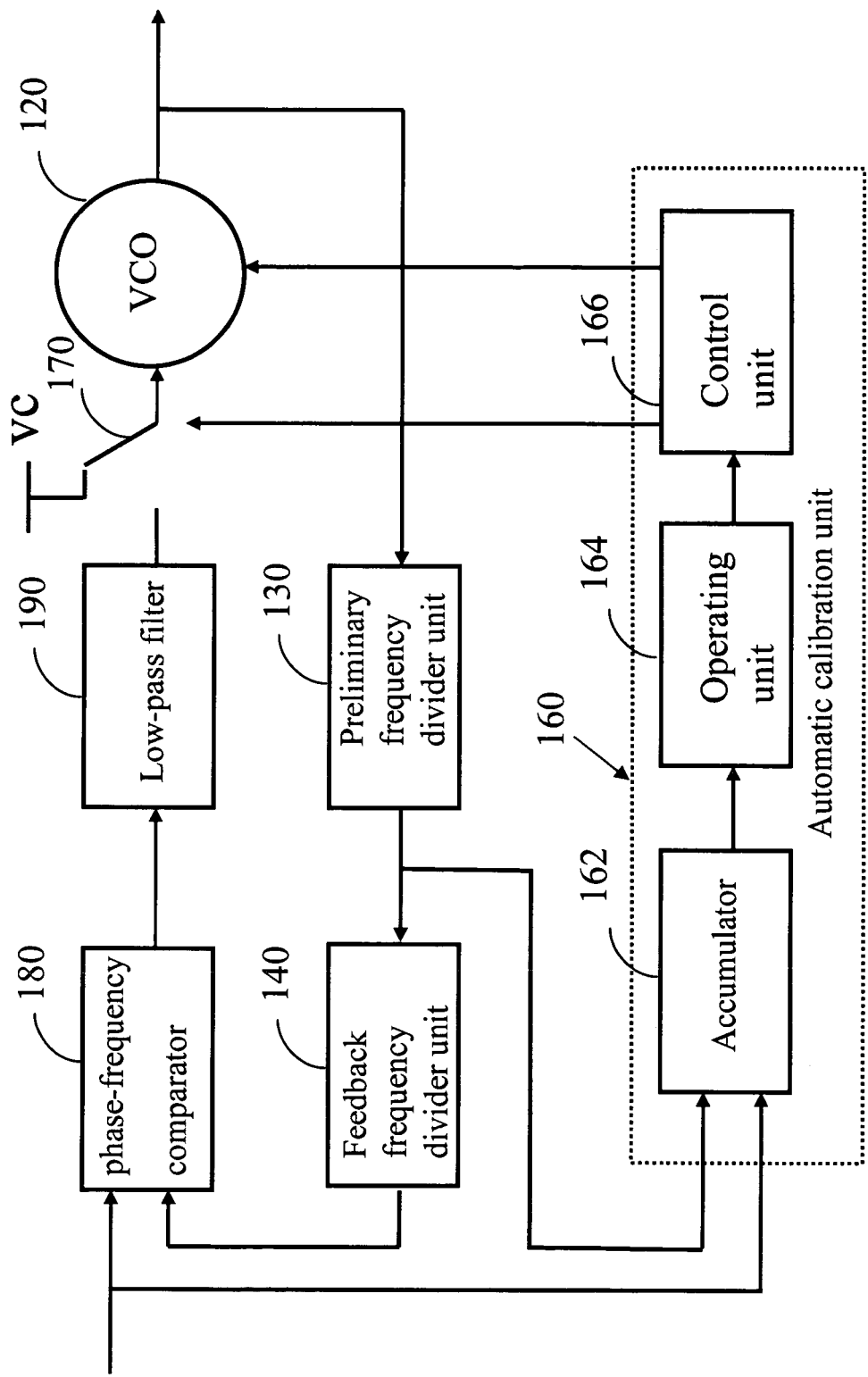
FIG. 2 shows a first embodiment of the invention.

The frequency synthesizing device with automatic calibration according to a first embodiment of the invention, as shown in FIG. 2, has a voltage-controlled oscillator (VCO) 120, a preliminary frequency divider unit 130, a feedback frequency divider unit 140, an automatic calibration unit 160, and a phase-frequency comparator 180. The VCO 120 has many working bands, which may or may not overlap with each other.

The VCO 120 receives a coarse-tuned signal and a fine-tuned signal, and generates an output signal in the working band set by the coarse-tuned signal. The coarse-tuned signal is an N-bit digital signal, and the fine-tuned signal is an analog signal. The preliminary frequency divider unit 130 receives the output signal and generates an intermediate signal by frequency dividing. The feedback frequency divider unit 140 receives the intermediate signal and generates a feedback signal by frequency dividing. The automatic calibration unit 160 receives the input signal and the intermediate signal, and generates a coarse-tuned signal.

The automatic calibration unit 160 includes an accumulator 162, an operating unit 164, and a control unit 166. The accumulator 162 takes the intermediate signal as an input and computes the number of periods of the intermediate signal within one period of a comparison signal, obtaining the frequency of the intermediate signal. The operating unit 164 determines the working band of the predetermined frequency according to a first frequency and a second frequency. The control unit 166 is connected to the operating unit 164 to generate a coarse-tuned control signal.

The phase-frequency comparator 180 compares the input signal and the feedback signal and generates an error according to the frequency and phase differences between the input signal and the feedback signal. The fine-tuned signal is generated according to the error signal. The low-pass filter 190 is connected between the phase-frequency comparator 180 and the VCO 120 to receive the error signal and generate the fine-tuned signal. A switch 170 is provided for the VCO 120 to switch between the low-pass filter 190 and a fixed voltage VC. When the VCO is connected to the low-pass filter 190, the VCO receives the fine-tuned signal from the low-pass filter 190. When the VCO is connected to the fixed voltage VC, the fine-tuned signal is the fixed voltage VC. The switch 170 is controlled by a switch control signal generated by the automatic calibration unit 160.

The frequency locking task of the frequency synthesizing device can be divided into four stages.

During the first stage, the switch control signal generated by the automatic calibration unit 160 controls the analog input terminal of the VCO 120 to connect to the fixed voltage VC. The coarse-tuned signal of the automatic calibration unit 160 sets the VCO 120 to a band. The accumulator 162 and the operating unit 164 compute to obtain a first frequency.

During the second stage, the coarse-tuned signal of the automatic calibration unit 160 sets the VCO to another band. The accumulator 162 and the operating unit 164 compute to obtain a second frequency.

During the third stage, the control unit 166 determines according to the predetermined frequency to be lock and the computation result of the operating unit 164 to output an appropriate N-bit digital control signal to the VCO 120. This determines the appropriate working band of the VCO 120.

During the fourth stage, the automatic calibration unit 160 connects the analog input terminal of the VCO back to the low-pass filter 190, letting the frequency synthesizer enter the frequency locking state.

Figure 3:
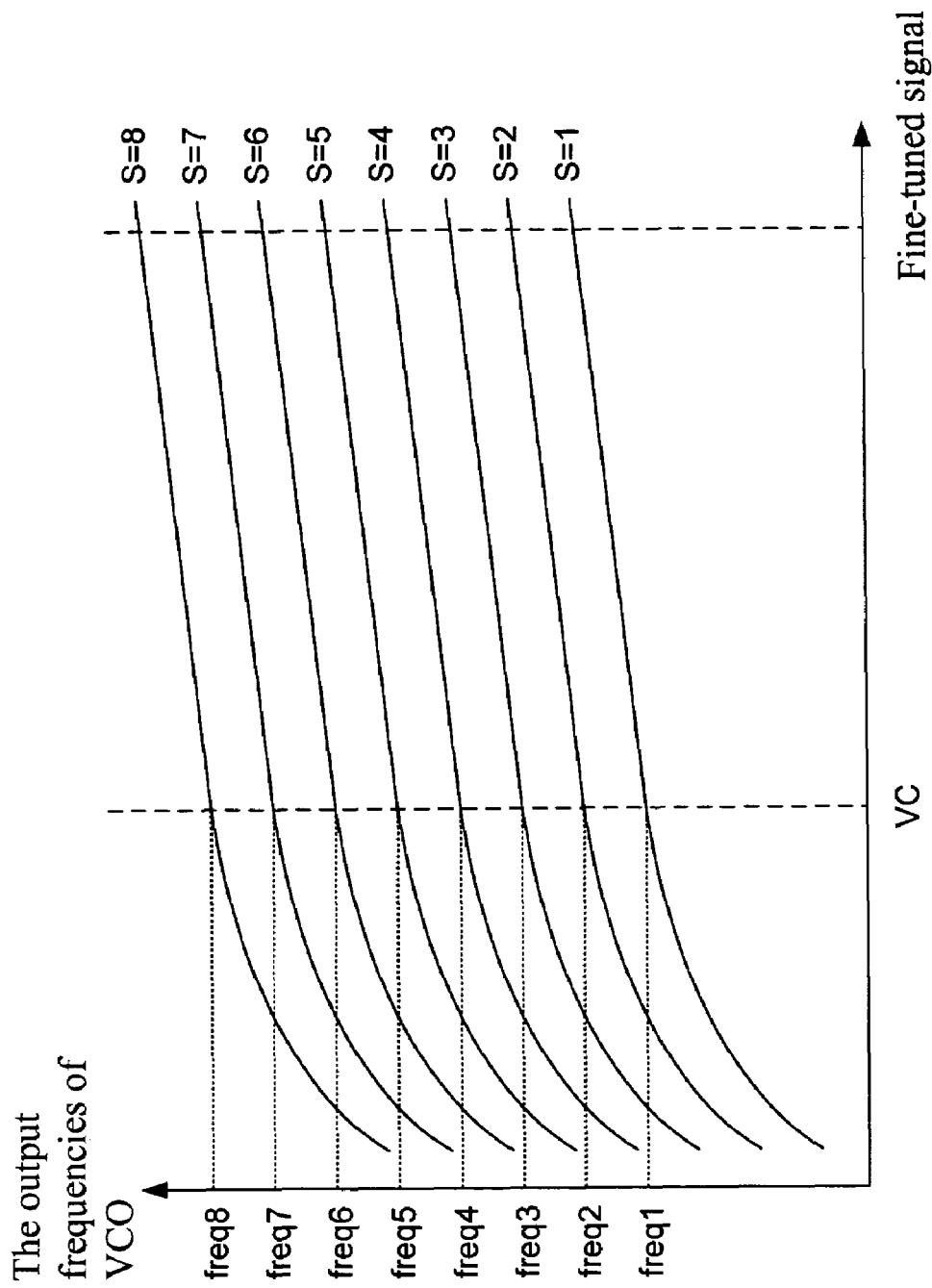
FIG. 3 shows the characteristic curves of the VCO.

FIG. 3 shows the characteristic curves of the VCO.

For example, the band of the VCO 120 set in the first stage is S=1, obtaining the first frequency freq1. In the second stage, the band of the VCO 120 is S=8, obtaining the second frequency freq8. Since the characteristic curves of the VCO have constant intervals, one can obtain frequencies from freq1 to freq8 by interpolation, rendering the working frequency that the predetermined frequency belongs to.

As another example, the band of the VCO 120 set in the first stage is S=1, obtaining the first frequency freq1. In the second stage, the band of the VCO 120 is S=2, obtaining the second frequency freq2. Since the characteristic curves of the VCO have constant intervals, one can obtain frequencies from freq1 to freq8 by extrapolation, rendering the working frequency that the predetermined frequency belongs to.

Figure 4:
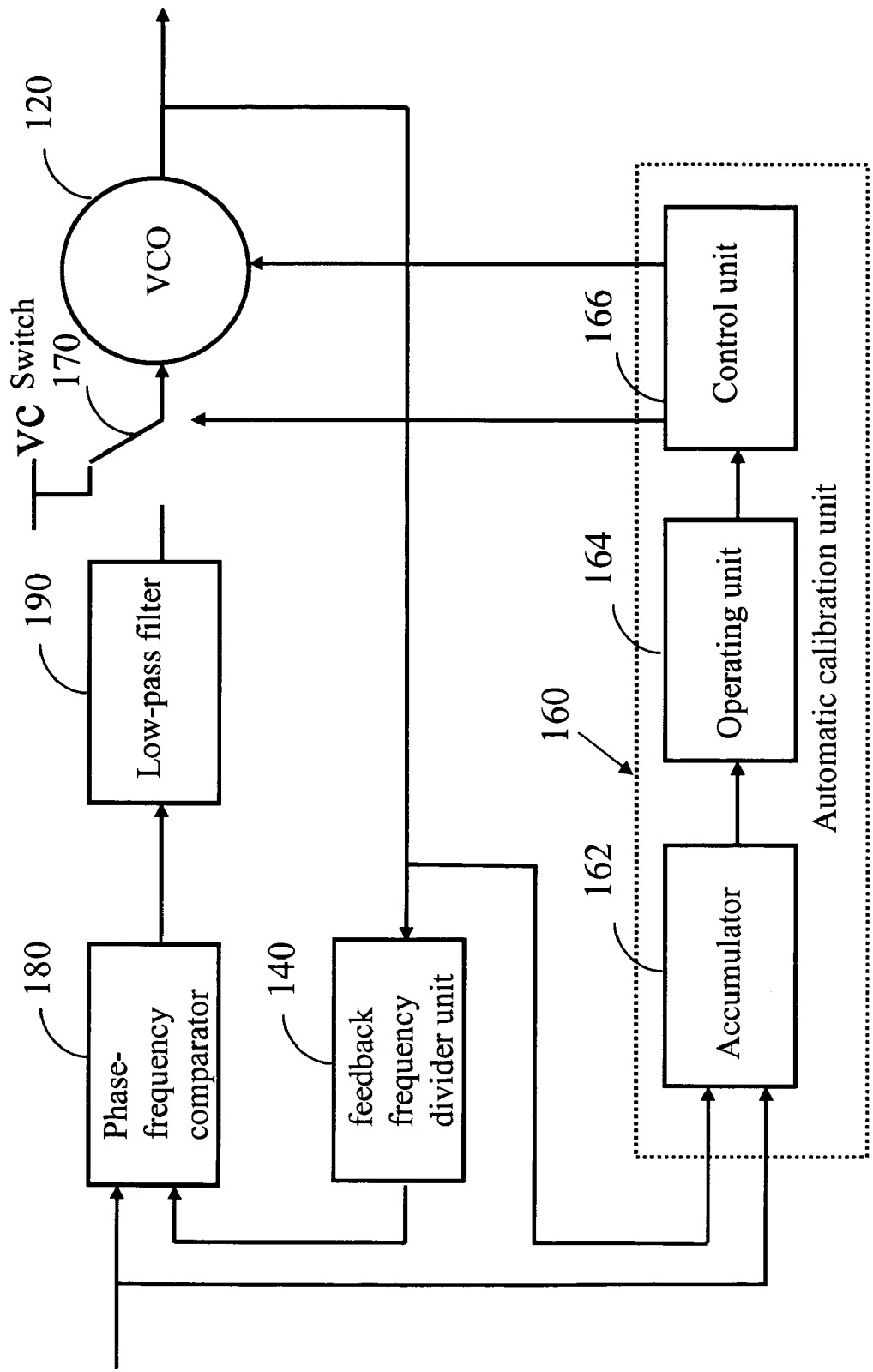
FIG. 4 shows a second embodiment of the invention.

Please refer to FIG. 4 for a second embodiment of the invention.

The frequency synthesizing device with automatic calibration includes a VCO 120, a feedback frequency divider unit 140, an automatic calibration unit 160, and a phase-frequency comparator 180.

The primary difference between the second embodiment and the first embodiment is the omission of the preliminary frequency divider unit. The automatic calibration unit 160 directly receives the output signal. The feedback frequency divider unit 140 also directly receives the output signal. This embodiment is suitable for systems with an automatic calibration unit operating at a sufficiently high frequency.

The automatic calibration unit 160 receives the input signal and the output signal, and generates a coarse-tuned signal.

The automatic calibration unit 160 includes an accumulator 162, an operating unit 164, and a control unit 166. The accumulator 162 receives the output signal as the input and computes the number of periods of the intermediate signal within one period of a comparison signal, obtaining the frequency of the intermediate signal. The operating unit 164 determines the working band of the predetermined frequency according to a first frequency and a second frequency. The control unit 166 is connected to the operating unit 164 to generate a coarse-tuned control signal. The feedback frequency divider unit 140 receives the output signal and generates a feedback signal by frequency dividing.

Certain variations would be apparent to those skilled in the art, which variations are considered within the spirit and scope of the claimed invention.

What is claimed is:

1. A frequency synthesizing device with automatic calibration for synthesizing a signal with a predetermined frequency, comprising:

a voltage-controlled oscillator (VCO), which has a plurality of working bands, receives a coarse-tuned signal and a fine-tuned signal, and generates an output signal in the working band set by the coarse-tuned signal;

a preliminary frequency divider unit, which receives the output signal and generates an intermediate signal by frequency dividing;

a feedback frequency divider unit, which receives the intermediate signal and generates a feedback signal by frequency dividing;

an automatic calibration unit, which receives an input signal and the intermediate signal and generates the coarse-tuned signal;

a phase-frequency comparator, which compares the input signal and the feedback signal and generates an error signal according to the frequency and phase differences between the input signal and the feedback signal; and a low-pass filter, which filters the error signal and generates the fine-tuned signal.

2. The frequency synthesizing device with automatic calibration of claim 1, wherein the working bands of the VCO overlap with each other.

3. The frequency synthesizing device with automatic calibration of claim 1, wherein the working bands of the VCO do not overlap with each other.

4. The frequency synthesizing device with automatic calibration of claim 1, wherein the automatic calibration unit generates the coarse-tuned signal according to the predetermined frequency, a first frequency and a second frequency, the first frequency and the second frequency being obtained from the output signal by adjusting the VCO to two different working bands when the fine-tuned signal is a fixed voltage.

5. The frequency synthesizing device with automatic calibration of claim 4, wherein the automatic calibration unit generates the coarse-tuned signal by interpolation.

6. The frequency synthesizing device with automatic calibration of claim 4, wherein the automatic calibration unit generates the coarse-tuned signal by extrapolation.

7. The frequency synthesizing device with automatic calibration of claim 4 further comprising a switch that connects the VCO to one of the low-pass filter and the fixed voltage.

8. The frequency synthesizing device with automatic calibration of claim 7, wherein the switch is controlled by a switch control signal generated by the automatic calibration unit.

9. The frequency synthesizing device with automatic calibration of claim 4, wherein the automatic calibration unit comprises:

an accumulator, which takes the intermediate signal as the input and computes the number of periods thereof, thereby obtaining the frequency of the intermediate signal;

an operating unit, which computes the working band of the predetermined frequency according to the first frequency and the second frequency; and a control unit, which is connected to the operating unit to generate the coarse-tuned control signal.

10. The frequency synthesizing device with automatic calibration of claim 1, wherein the coarse-tuned signal is a digital signal.

11. The frequency synthesizing device with automatic calibration of claim 1, wherein in a frequency unlocking state, the automatic calibration unit sets the working band of the VCO in two of the working bands and determines all of the working bands according to the input signal and the intermediate signal during setting the working band of the VCO in the two of the working bands.

12. A frequency synthesizing device with automatic calibration for synthesizing a signal with a predetermined frequency, comprising:

a voltage-controlled oscillator (VCO), which has a plurality of working bands, receives a coarse-tuned signal and a fine-tuned signal, and generates an output signal in the working band set by the coarse-tuned signal;

a feedback frequency divider unit, which receives the output signal and generates a feedback signal by frequency dividing;

an automatic calibration unit, which receives an input signal at an input frequency and the output signal at an output frequency and generates the coarse-tuned signal;

a phase-frequency comparator, which compares the input signal and the feedback signal and generates an error signal according to the frequency and phase differences between the input signal and the feedback signal; and a low-pass filter, which filters the error signal and generates the fine-tuned signal;

wherein the automatic calibration unit generates the coarse-tuned signal according to the predetermined frequency, a first frequency and a second frequency, the first frequency and the second frequency being obtained from the output signal by adjusting the VCO to two different working bands when the fine-tuned signal is a fixed voltage.

13. The frequency synthesizing device with automatic calibration of claim 12, wherein the working bands of the VCO overlap with each other.

14. The frequency synthesizing device with automatic calibration of claim 12, wherein the working bands of the VCO do not overlap with each other.

15. The frequency synthesizing device with automatic calibration of claim 12, wherein the automatic calibration unit generates the coarse-tuned signal by interpolation.

16. The frequency synthesizing device with automatic calibration of claim 12, wherein the automatic calibration unit generates the coarse-tuned signal by extrapolation.

17. The frequency synthesizing device with automatic calibration of claim 12 further comprising a switch that connects the VCO to one of the low-pass filter and the fixed voltage.

18. The frequency synthesizing device with automatic calibration of claim 17, wherein the switch is controlled by a switch control signal generated by the automatic calibration unit.

19. The frequency synthesizing device with automatic calibration of claim 12, wherein the automatic calibration unit comprises:

an accumulator, which takes the intermediate signal as the input and computes the number of periods thereof, thereby obtaining the frequency of the intermediate signal;

an operating unit, which computes the working band of the predetermined frequency according to the first frequency and the second frequency; and a control unit, which is connected to the operating unit to generate the coarse-tuned control signal.

20. The frequency synthesizing device with automatic calibration of claim 12, wherein the coarse-tuned signal is a digital signal.

21. A frequency synthesizing device with automatic calibration for synthesizing a signal with a predetermined frequency, comprising:

a voltage-controlled oscillator (VCO), which has a plurality of working bands, receives a coarse-tuned signal and a fine-tuned signal, and generates an output signal in the working band set by the coarse-tuned signal;

a feedback frequency divider unit, which receives the output signal and generates a feedback signal by frequency dividing;

an automatic calibration unit, which receives an input signal at an input frequency and the output signal at an output frequency and generates the coarse-tuned signal;

a phase-frequency comparator, which compares the input signal and the feedback signal and generates an error signal according to the frequency and phase differences between the input signal and the feedback signal; and a low-pass filter, which filters the error signal and generates the fine-tuned signal;

wherein in a frequency unlocking state, the automatic calibration unit sets the working band of the VCO in two of the working bands and determines all of the working bands according to the input signal and the output signal during setting the working band of the VCO in the two of the working bands.

22. The frequency synthesizing device with automatic calibration of claim 21, wherein the working bands of the VCO overlap with each other.

23. The frequency synthesizing device with automatic calibration of claim 21, wherein the working bands of the VCO do not overlap with each other.

24. The frequency synthesizing device with automatic calibration of claim 21, wherein the automatic calibration unit generates the coarse-tuned signal according to the predetermined frequency, a first frequency and a second frequency, the first frequency and the second frequency being obtained from the output signal by adjusting the VCO to two different working bands when the fine-tuned signal is a fixed voltage.

25. The frequency synthesizing device with automatic calibration of claim 24, wherein the automatic calibration unit generates the coarse-tuned signal by interpolation.

26. The frequency synthesizing device with automatic calibration of claim 24, wherein the automatic calibration unit generates the coarse-tuned signal by extrapolation.

27. The frequency synthesizing device with automatic calibration of claim 24 further comprising a switch that connects the VCO to one of the low-pass filter and the fixed voltage.

28. The frequency synthesizing device with automatic calibration of claim 27, wherein the switch is controlled by a switch control signal generated by the automatic calibration unit.

29. The frequency synthesizing device with automatic calibration of claim 24, wherein the automatic calibration unit comprises:

an accumulator, which takes the intermediate signal as the input and computes the number of periods thereof, thereby obtaining the frequency of the intermediate signal;

an operating unit, which computes the working band of the predetermined frequency according to the first frequency and the second frequency; and a control unit, which is connected to the operating unit to generals the coarse-tuned control signal.

30. The frequency synthesizing device with automatic calibration of claim 21, wherein the coarse-tuned signal is a digital signal.

* * * * *